(12) United States Patent
Kumagai et al.

(10) Patent No.: US 7,701,241 B2
(45) Date of Patent: Apr. 20, 2010

(54) CIRCUIT FOR PROTECTING DUT, METHOD FOR PROTECTING DUT, TESTING APPARATUS AND TESTING METHOD

(75) Inventors: Yasunori Kumagai, Nirasaki (JP); Dai Shinozaki, Fuchu (JP); Shigekazu Komatsu, Nirasaki (JP); Katsuaki Sakamoto, Sagamihara (JP)

(73) Assignee: Tokyo Electron Limited, Tokyo (JP)

( * ) Notice: Subject to any disclaimer, the term of this patent is extended or adjusted under 35 U.S.C. 154(b) by 442 days.

(21) Appl. No.: 11/689,149

(22) Filed: Mar. 21, 2007

(65) Prior Publication Data

US 2007/0223156 A1 Sep. 27, 2007

(30) Foreign Application Priority Data

Mar. 22, 2006 (JP) .............................. 2006-079637

(51) Int. Cl.
*G01R 31/26* (2006.01)
(52) U.S. Cl. ...................... 324/765; 324/763; 361/91.7
(58) Field of Classification Search ......... 324/750–768, 324/158.1, 519, 531, 527, 522, 523, 548, 324/549; 257/355, 356; 361/91.7, 91.5, 361/111
See application file for complete search history.

(56) References Cited

U.S. PATENT DOCUMENTS

| 6,268,990 | B1 | 7/2001 | Ogura et al. |
| 6,650,103 | B2 * | 11/2003 | Righter ................... 324/117 H |
| 6,933,741 | B2 * | 8/2005 | Duvvury et al. ............. 324/765 |

FOREIGN PATENT DOCUMENTS

KR        2000-0006447        1/2000

* cited by examiner

*Primary Examiner*—Minh N Tang
*Assistant Examiner*—Trung Q Nguyen
(74) *Attorney, Agent, or Firm*—Oblon, Spivak, McClelland, Maier & Neustadt, L.L.P.

(57) ABSTRACT

A circuit for protecting a DUT is disposed in parallel with a DUT which is supplied with current via wirings and switchable between conducting and non-conducting state. The circuit is switchable between conducting and non-conducing state and switched from non-conducting state to conducting state as the DUT is switched from conducting state to non-conducting state.

14 Claims, 6 Drawing Sheets

CIRCUIT FOR PROTECTING DUT, METHOD FOR PROTECTING DUT, TESTING APPARATUS AND TESTING METHOD

FIELD OF THE INVENTION

The present invention relates to a circuit for protecting a DUT (Device Under Test), a method for protecting a DUT, a testing apparatus and a testing method; and, more particularly, to a circuit for protecting a DUT which is switchable between conducting and non-conducting state.

BACKGROUND OF THE INVENTION

As for a power device enabling high current to flow, there has been known an insulated gate bipolar transistor (hereinafter, referred to as "IGBT"). The IGBT is a bipolar transistor in which a MOSFET (Metal Oxide Semiconductor Field Effect Transistor) is installed in a gate portion The IGBT is driven by a gate-emitter voltage to switch conducting (ON) and non-conducting (OFF) state between a collector and an emitter.

A plurality of power devices using the IGBTs are formed on a wafer by a deposition process, an etching process and the like. Each of the power devices is supplied with current and subjected to an electrical characteristic test. The electrical characteristic test thereof is performed by an inspection device including a mounting table for mounting thereon a wafer, a probe card facing the mounting table and having a plurality of contactors, and a test circuit connected with the probe card via a wiring. In the inspection device, a specific power device on the wafer on the mounting table and the contactors of the probe card are position-aligned and, then, the mounting table is raised so that the specific power device formed on the wafer can contact with the contactors. Next, the specific power device in ON state is supplied with high current via the corresponding contactors and subjected to the electrical characteristic test.

In this case, if the power device is short-circuited during the electrical characteristic test, over-current is abruptly applied, which results in a breakdown of the corresponding power device, the probe card, the test circuit and the like. To that end, there is known an inspection device for suppressing an abrupt application of over-current by providing a current limiting circuit in a wiring for connecting a test circuit and a probe card (see, e.g., Japanese Patent Laid-open Application No. 2004-77166)

Further, even when the power device is not short-circuited, over-voltage may be applied to the power device, as will be described later. For example, a wiring of an inspection device has a specific parasitic inductance due to its length of several meters. During the electrical characteristic test of the power device, relatively gradually changing current or uniform current flows in the wiring. However, when the power device is switched to OFF state after the electrical characteristic test, the current flowing in the wiring abruptly changes. At this time, the over-voltage is caused by the abrupt current change and the parasitic inductance of the wiring and then applied to the power device connected with the wiring.

As for a device for reducing over-voltage caused by switching the power device to OFF state, there is known a snubber circuit. The snubber circuit converts the over-voltage into heat and consumes the heat (see, e.g., "Hitachi Power Device Technical Information PD Room", [online], May, 1997, Hitachi, Ltd., [searched on 2005 Oct. 7], Internet, URL:http://www.pi.hitachi.co.jp/ICSFiles/afieldfile/2004/06/14/pdrm06j.pdf)

However, the snubber circuit itself has a parasitic inductance due to its wiring. Further, since the snubber circuit simply consumes the over-voltage, the parasitic inductance is not removed by the snubber circuit and, also, it is not possible to completely prevent the over-voltage from being applied to the power device. Moreover, in order to reduce the parasitic inductance of the snubber circuit, a wiring length needs to be reduced by installing the snubber circuit near the power device. However, an installation area is insufficient due to a plurality of wirings of the inspection apparatus, which makes it difficult to arrange the snubber circuit near the power device. In other words, the over-voltage is not prevented from being applied to the power device.

SUMMARY OF THE INVENTION

It is, therefore, an object of the present invention to provide a circuit for protecting a DUT, a method for protecting a DUT, a testing apparatus and a testing method, which are capable of preventing over-voltage from being applied to the DUT.

In accordance with a first aspect of the invention, there is provided a circuit for protecting a DUT, the circuit being disposed in parallel with a DUT which is supplied with current via wirings and switchable between conducting and non-conducting state, wherein the circuit is switchable between conducting and non-conducing state and switched from non-conducting state to conducting state as the DUT is switched from conducting state to non-conducting state.

In accordance with a second aspect of the invention, there is provided a method for protecting a DUT which is supplied with current via wirings and switchable between conducting and non-conducting state, the method including the steps of:

arranging a circuit for protecting a DUT in parallel with the DUT, the circuit being switchable between conducting and non-conducting state; and switching the circuit from non-conducting state to conducting state as the DUT is switched from conducting state to non-conducting state.

Preferably, the circuit is switched from non-conducting state to conducting state before the DUT is switched from conducting state to non-conducting state.

Preferably, the circuit is switched from non-conducting state to conducting state after the DUT is switched to desired test state.

Preferably, the circuit and the DUT have insulated gate bipolar transistors.

In accordance with a third aspect of the invention, there is provided a testing apparatus including:

a power supply for supplying current;

a wiring for connecting a DUT which is switchable between conducting and non-conducting state with the power supply; and a circuit for protecting a DUT, the circuit being disposed in parallel with the DUT and switchable between conducting and non-conducting state, wherein the circuit is switched from non-conducting state to conducting state as the DUT to which the current is supplied is switched from conducting state to non-conducting state.

In accordance with a fourth aspect of the invention, there is provided a testing method using a testing apparatus including a power supply for supplying current and a wiring for connecting a DUT which is switchable between conducting and non-conducting state with the power supply, the method including the steps of:

arranging a circuit for protecting a DUT in parallel with the DUT, the circuit being switchable between conducting and non-conducting state;

performing a dynamic characteristic test, wherein the current is supplied to the DUT by switching the DUT to conducting state; and switching the circuit from non-conducting state to conducting state as the DUT is switched from conducting state to non-conducting state.

Preferably, the testing method in accordance with the fourth aspect of the invention further includes the step of performing a static characteristic test of the DUT.

Preferably, the testing method in accordance with the fourth aspect of the invention further includes:

performing a first static characteristic test of the DUT before performing the dynamic characteristic test; and performing a second static characteristic test of the DUT after performing the dynamic characteristic test.

In accordance with the first to the fourth aspect of the present invention, the circuit disposed in parallel with the DUT is switched from non-conducting state to conducting state as the DUT is switched from conducting state to non-conducting state. Therefore, even if the DUT is switched from conducting state to non-conducting state, the current flowing in the wiring does not abruptly changes. Hence, it is possible to avoid an occurrence of over-voltage caused by an abrupt current change and a parasitic inductance of the wiring and further to prevent the over-voltage from being applied to the DUT.

By switching the circuit from non-conducting state to conducting state before the DUT is switched from conducting state to non-conducting state, a path of the current is not cut off and, also, an abrupt current change can be completely prevented. As a consequence, the over-voltage can be completely prevented from being applied to the DUT.

By switching the circuit from non-conducting state to conducting state after the DUT is switched to desired test state, a test for the DUT is not hindered by effects caused by switching the circuit from non-conducting state to conducting state.

By providing the circuit and the DUT with insulated gate bipolar transistors (IGBTs), the current can effectively flow in the circuit when the DUT is switched from conducting state to non-conducting state. Further, the circuit having the IGBTs can be installed in the inspection device due to its compactness.

By performing a static characteristic test, it is possible to check whether the DUT is broken or not, thereby preventing inferior goods from being supplied.

By performing a static characteristic test of the DUT before and after it is subjected to a dynamic characteristic test, it is possible to avoid an unnecessary performance of the dynamic characteristic test and also possible to check whether the DUT is broken or not through the dynamic characteristic test, and thus preventing inferior goods from being supplied.

BRIEF DESCRIPTION OF THE DRAWINGS

The above and other objects and features of the present invention will become apparent from the following description of embodiments, given in conjunction with the accompanying drawings, in which:

FIGS. 5A and 5B describe a change in a current supply direction in accordance with a switching of ON/OFF state in each of IGBTs of the power device and a switching of ON/OFF state in an IGBT of a power device protection circuit, wherein FIG. 5A depicts a case where the respective IGBTs of the power device are in ON state whereas the IGBT of the power device protection circuit is in OFF state, and FIG. 5B shows a case where the respective IGBTs of the power device are in OFF state whereas the IGBT of the power device protection circuit is in ON state; and FIGS. 6A and 6B present graphs illustrating an over-voltage application state to the power device in accordance with an existence of the power device protection circuit, wherein FIG. 6A shows a graph describing a case where the power device protection circuit does not exist, and FIG. 6B provides a graph depicting a case where the power device protection circuit exists.

DETAILED DESCRIPTION OF THE EMBODIMENT

Hereinafter, embodiments of the present invention will be described in detail with reference to the accompanying drawings.

Figure 1:
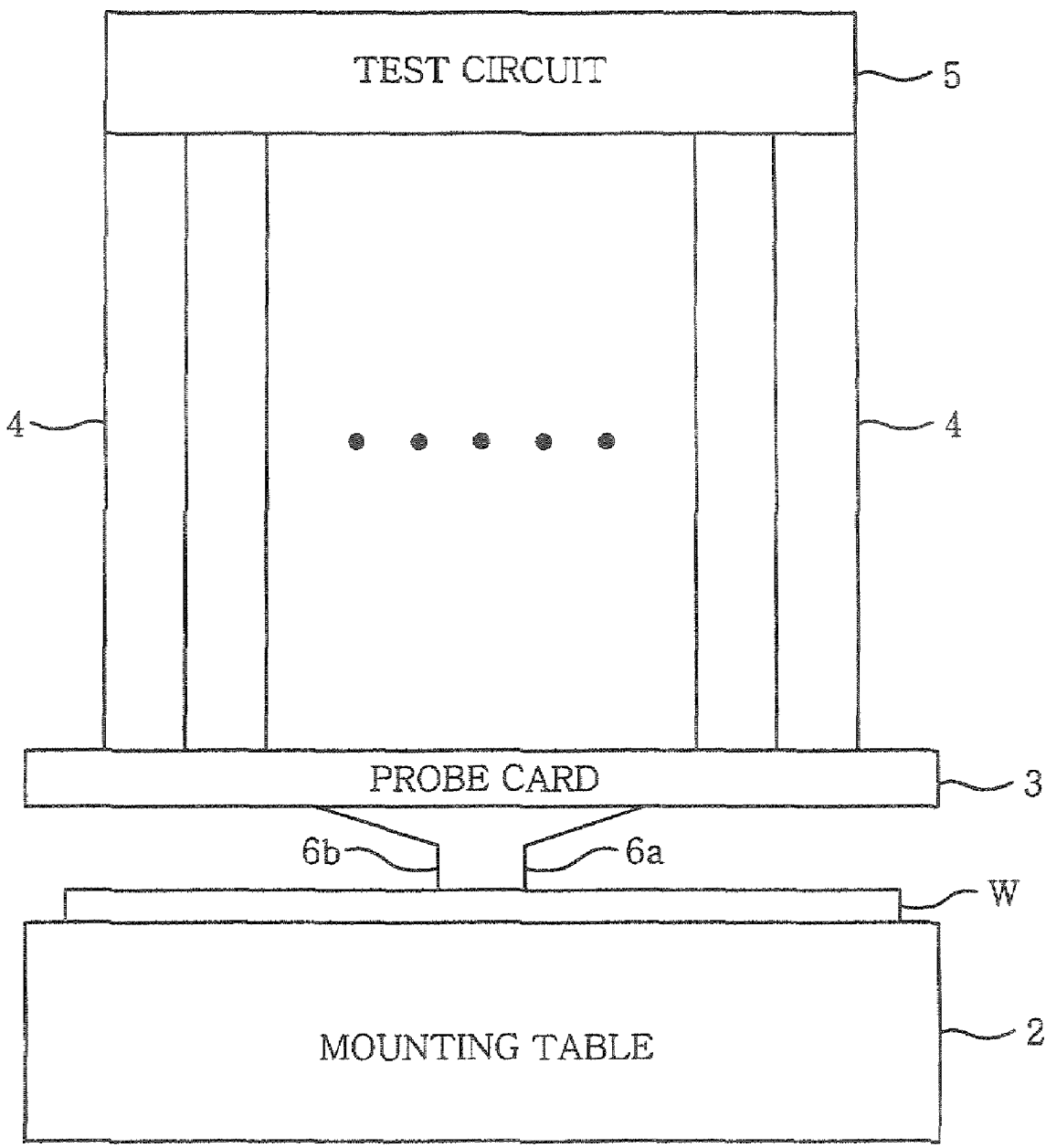
FIG. 1 shows a schematic configuration of an inspection device in accordance with an embodiment of the present invention.

FIG. 1 shows a schematic configuration of an inspection device in accordance with an embodiment of the present invention.

Referring to FIG. 1, there is illustrated an inspection device 1 including a mounting table 2 capable of moving in a horizontal and a vertical direction, for mounting thereon a wafer W where a plurality of power devices 10 (DUTs) to be described later are formed; a probe card 3 disposed to face the wafer W mounted on the mounting table 2; a test circuit 5 connected with the probe card 3 via signal lines (wirings) 4; and a controller (not shown) for controlling operations of each component.

Figure 2:
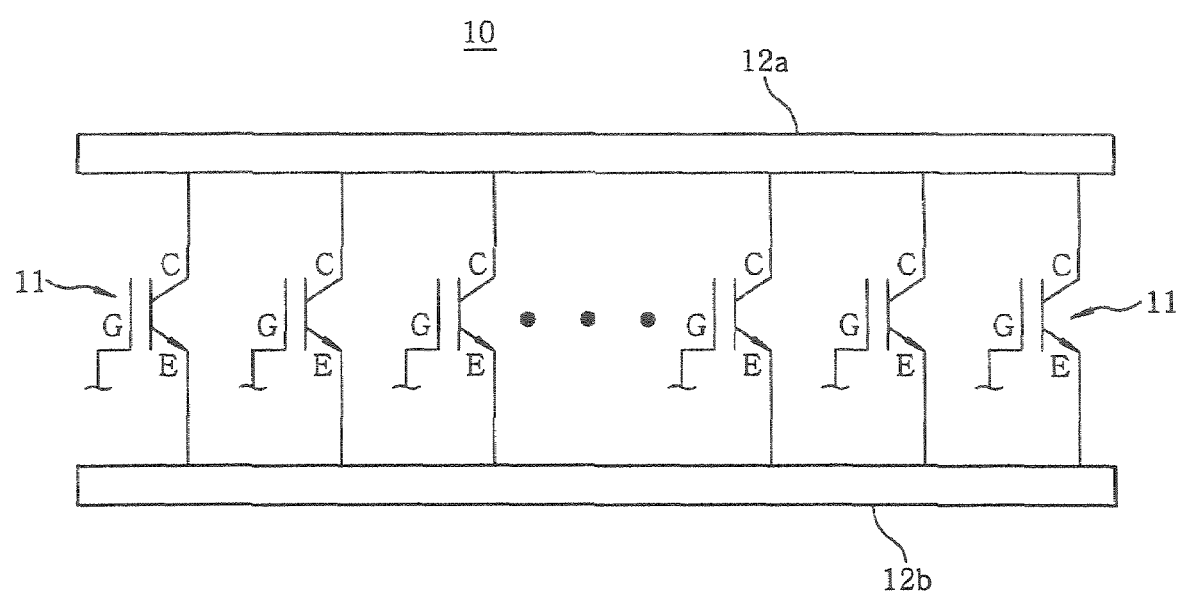
FIG. 2 describes a circuit diagram illustrating a schematic configuration of a power device serving as a DUT.

As shown in FIG. 2, each of the power devices 10 has a plurality of, e.g., 1 to 20000, IGBTs 11. A collector and an emitter of each of the IGBTs 11 are connected with a conductor 12a and a conductor 12b, respectively. That is, the IGBTs 11 are disposed in parallel with each other. Further, gates of the IGBTs 11 are integrated (hereinafter, referred to as "integrated gate"). In general, the IGBTs 11 have high withstand voltage and are arranged in parallel in the power device 10, so that high current can flow in the power device 10.

Referring back to FIG. 1, the probe card 3 has 298 contactors 6a and two contactors 6b, for example. Each of the contactors 6a corresponds to the conductor 12b of the emitter side, whereas each of the contactors 6b corresponds to the integrated gate of the IGBTs 11. In the inspection device 1, the controller controls a position alignment between a specific power device 10 on the wafer W mounted on the mounting table 2 and the contactors 6a and 6b of the probe card 3, thus making the conductor 12b of the emitter side contact with the contactors 6a and also making the integrated gate of the IGBTs 11 contact with the contactors 6b.

Figure 3:
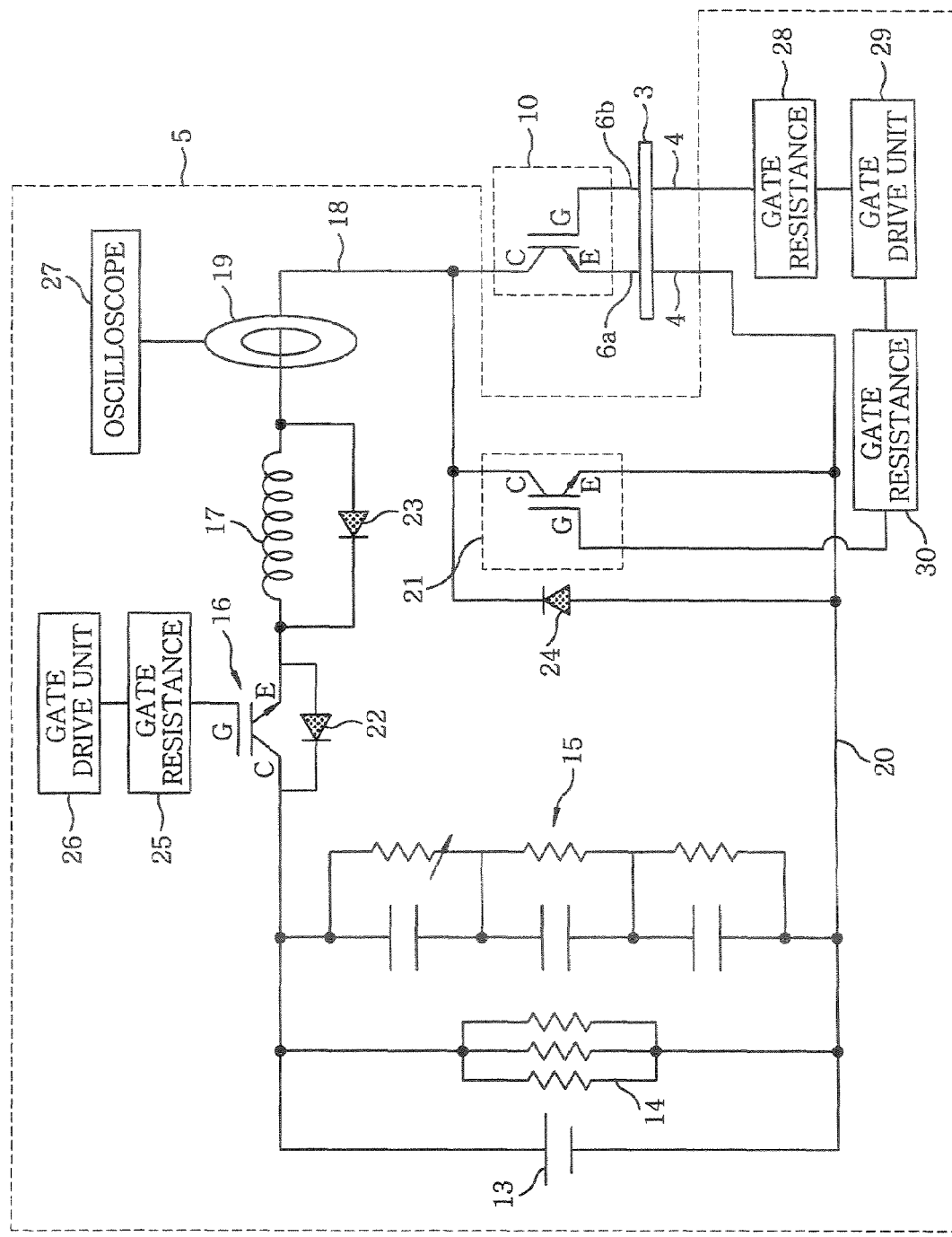
FIG. 3 provides a circuit diagram depicting a test circuit, a probe card, signal lines and the power device of the inspection device of FIG. 1.

FIG. 3 provides a circuit diagram depicting a test circuit, a probe card, signal lines and the power device in the inspection device of FIG. 1. In FIG. 3, the power device is indicated as a single IGBT.

Referring to FIG. 3, there is illustrated the test circuit 5 including a DC power supply 13; a discharging resistance 14 having one end connected with a positive electrode of the DC power supply 13 and the other end connected with a negative electrode of the DC power supply 13; a capacitor group 15 disposed in parallel with the discharge resistance 14 having therein three capacitors disposed in series with each other; a test circuit protection IGBT 16 having a collector connected with the positive electrode of the DC power supply 13; a load coil 17 having one end connected with an emitter of the test circuit protecting IGBT 16; a wiring 18 for connecting the other end of the load coil 17 and the conductor 12a of the collector side of the power device 10; a wiring 20 for connecting the conductor 12b of the emitter side of the power device 10 and the negative electrode of the DC power supply 13 via the contactors 6a, the probe card 3 and the signal line 4; and a round ring-shaped current detector 19 having a central opening for passing the wiring 18 therethrough.

Further, the test circuit 5 includes a power device protection circuit 21 (circuit for protecting a DUT). The power device protection circuit 21 has an IGBT, and the IGBT has a collector connected with the wiring 18 and an emitter connected with the wiring 20. Thus, the power device protection circuit 21 is disposed in parallel with the power device 10. A current capacity of the power device protection circuit 21 is set to be greater than that of the power device 10, and an inner resistance of the power device protection circuit 21 is set to be smaller than that of the power device 10.

Moreover, the test circuit protection IGBT 16, the load coil 17 and the power device protection circuit 21 in the test circuit 5 have regenerative current diodes 22, 23 and 24, respectively.

When the wiring 18 or 20 is short-circuited, the discharge resistance 14 emits electric charges accumulated in each of the wirings in the form of thermal energy. The capacitor group 15 accumulates a specific amount of electric charges from the DC power supply 13 and then supplies the accumulated electric charges in the form of current to the power device 10 via the test circuit protecting IGBT 16 and the load coil 17.

A gate of the test circuit protection IGBT 16 is connected with a gate drive unit 26 via a gate resistance (RG) 25. The gate drive unit 26 converts (switches) ON/OFF state of the test circuit protection IGBT 16 by applying a driving voltage to the gate, thereby controlling a start and a stop of the current supply to the power device 10.

The load coil 17 has a specific amount of inductance, e.g., 50 μH. Further, the load coil 17 is inserted between the capacitor group 15 and the power device 10 and thus controls the amount of current supplied from the capacitor group 15 to the power device 10.

The current detector 19 detects the amount of current flowing in the wiring 18. Further, the current detector 19 is connected with an oscilloscope 27 for displaying the amount of current detected by the current detector 19. Moreover, the current detector 19 and the gate drive unit 26 are connected with each other. Therefore, when the current detector 19 detects an abrupt increase in the current flowing in the wiring 18, a signal of the abrupt current increase is transmitted from the current detector 19 to the gate drive unit 26. Further, when the gate drive unit 26 receives the signal of abrupt current increase, the current supply to the power device 10 is stopped.

The integrated gate in the power device 10 is connected with a gate drive unit 29 via the contactors 6b, the probe card 3, the signal line 4 and the gate resistance 28. The gate drive unit 29 switches ON/OFF state of each of the IGBTs 11 in the power device 10 by applying a driving voltage to the integrated gate. Further, the gate drive unit 29 is connected with a gate of an IGBT of the power device protection circuit 21 via a gate resistance 30 and switches ON/OFF state of the IGBT of the power device protection circuit 21 by applying a driving voltage to the gate of the IGBT thereof.

The gate drive unit 29 selects a supply direction of the current flowing in the wiring 18 between the power device 10 and the power device protection circuit 21 by adjusting timing for switching ON/OFF state of the respective IGBTs 11 in the power device 10 and timing for switching ON/OFF state of the IGBT in the power device protection circuit 21.

Hereinafter, a power device characteristic test as a testing method in accordance with an embodiment of the present invention will be described.

Figure 4:
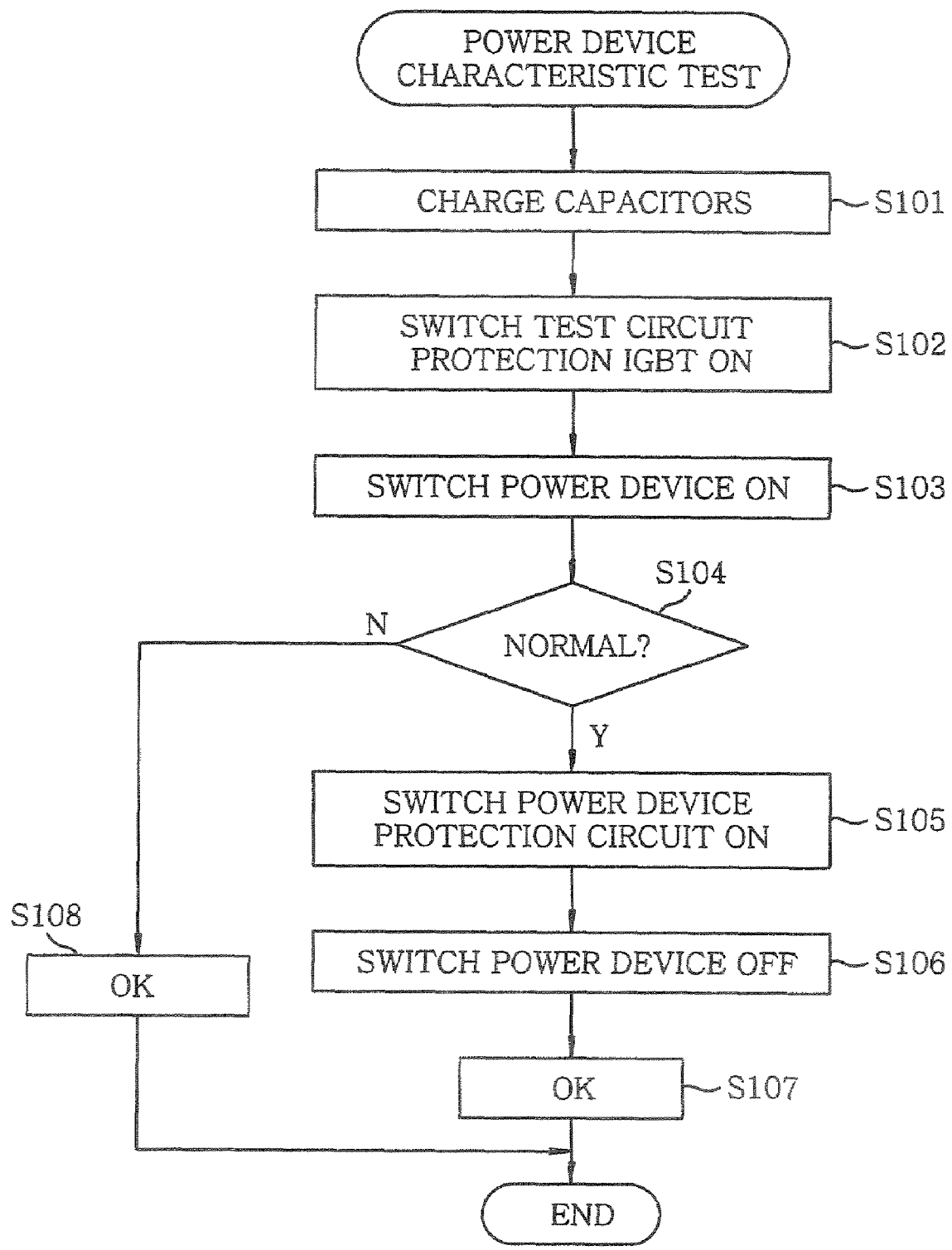
FIG. 4 illustrates a flowchart of a characteristic test process of the power device, as a testing method in accordance with an embodiment of the present invention.

FIG. 4 is a flowchart showing processes of a power device characteristic test as a testing method in accordance with an embodiment of the present invention. In this test, a position alignment is carried out between a specific power device 10 on the wafer W mounted on the mounting table 2 and the contactors 6a and 6b of the probe card 3, so that the conductor 12b of the emitter side becomes in contact with the contactors 6a and, also, the integrated gate of the power device 10 becomes in contact with the contactors 6b. Thereafter, the test circuit 5 is driven. Further, this test is performed as an inductive load test (hereinafter, referred to as "L load test") corresponding to a dynamic characteristic test of the power device 10.

Referring to FIG. 4, above of all, the DC power supply 13 connected with the capacitor group 15 by a switch (not shown) charges the respective capacitors of the capacitor group 15 with electric charges (step S101). When a total amount of the electric charges charged in the respective capacitors of the capacitor group 15 reaches a specific amount, the DC power supply 13 and the capacitor group 15 are separated from each other by the switch.

Next, the gate drive unit 26 switches the test circuit protection IGBT 16 from OFF state to ON state (step S102). Thereafter, the gate drive unit 29 switches the respective IGBTs 11 of the power device 10 from OFF state to ON state (step S103). In this case, the electric charges charged in the capacitor group 15 are supplied in the form of current to the collector of the power device 10 via the test circuit protection IGBT 16, the load coil 17 and the wiring 18. As time elapses, the current flowing between the collector and the emitter of the respective IGBTs 11, i.e., the current flowing in the power device 10, increases depending on an inductance of the load coil 17 or the amount of electric charges supplied from the capacitor group 15.

Then, it is checked whether the power device 10 is normal or abnormal depending on whether or not the increased current amount has reached a specific level (step S104). If it is checked that the power device 10 is abnormal because the current amount has not reached the specific level, the process proceeds to a step S108. After the power device 10 is determined to be "NG" in the step S108, this process is completed.

Figure 5A:
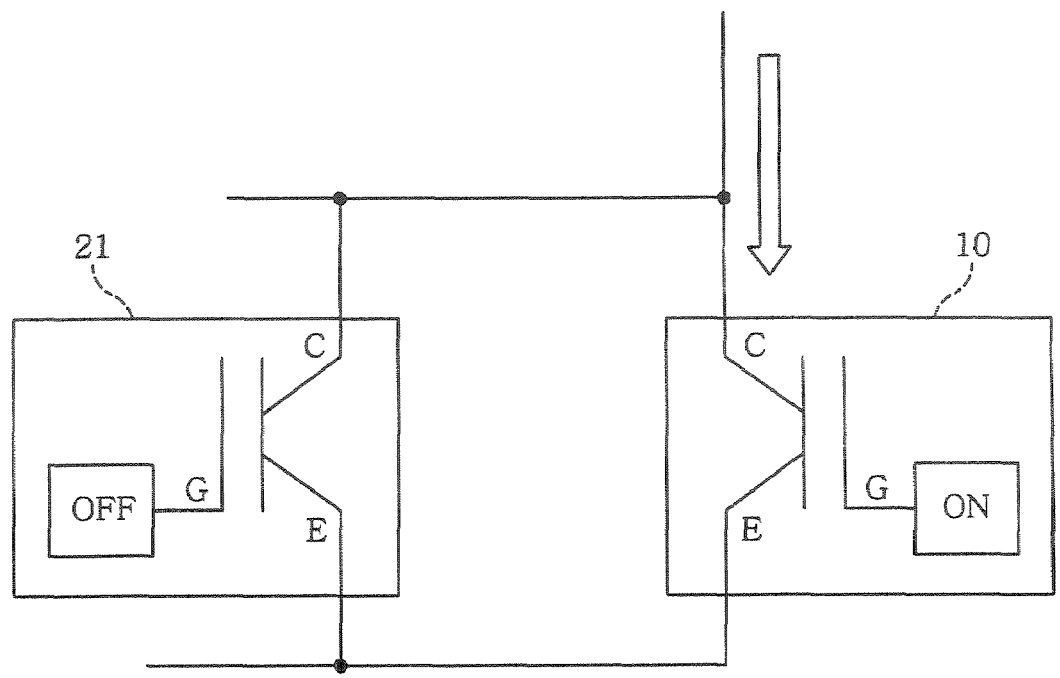
Figure 5B:
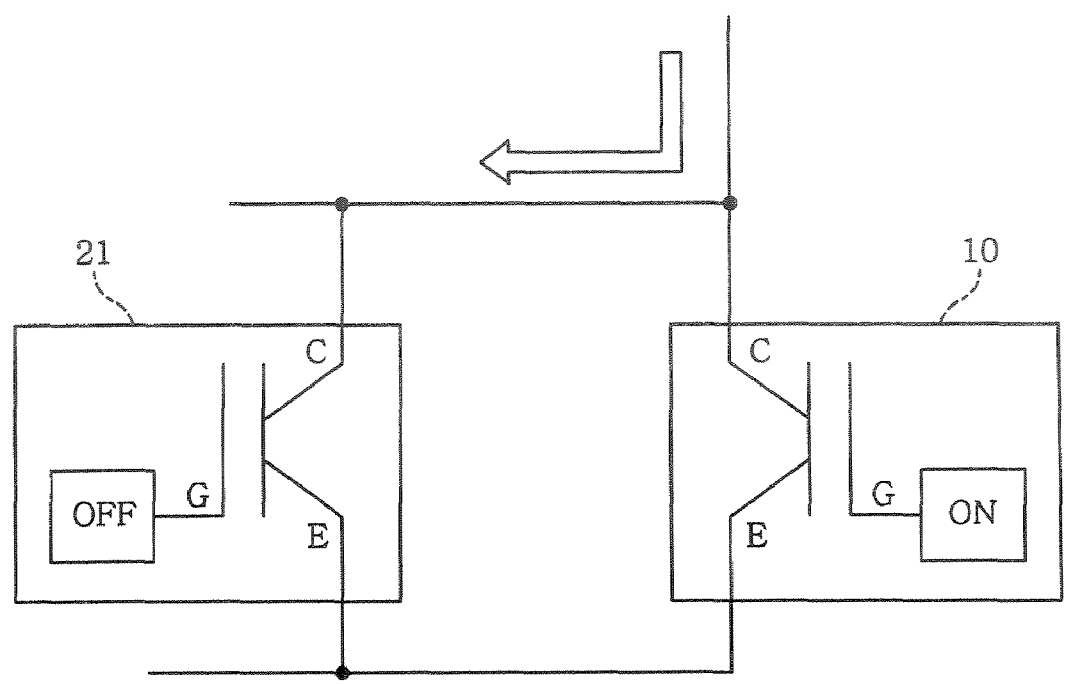

On the contrary, if it is checked in the step S104 that the power device 10 is normal because the current amount has reached the specific level (desired test state has been obtained), the gate drive unit 29 switches the IGBT of the power device protection circuit 21 from OFF state to ON state (step S105). Then, 200 nsec later, the gate drive unit 29 switches the respective IGBTs 11 of the power device 10 from ON state to OFF state (step S106). In the inspection device 1, when the respective IGBTs 11 of the power device 10 are in ON state whereas the IGBT of the power device protection circuit 21 is in OFF state (see FIG. 5A), the current (indicated by a white arrow in FIG. 5A) is supplied to the power device 10. However, when the respective IGBTs 11 of the power device 10 are in OFF state whereas the IGBT of the power device protection circuit 21 is in ON state (see FIG. 5B), the current (indicated by a white arrow in FIG. 5B) is supplied to the power device protection circuit 21. In this case, since the IGBT of the power device protection circuit 21 is switched to ON state before the respective IGBTs 11 of the power device 10 are switched to OFF state, a path of the current flowing in the wiring 18 or 20 is not cut off even when the respective IGBTs 11 of the power device 10 are switched from ON state to OFF state.

Next, the power device 10 is determined to be "OK" (step S107), and the test is completed.

In accordance with the processes of FIG. 4, the IGBT of the power device protection circuit 21 disposed in parallel with the power device 10 is switched from OFF state to ON state (step S105) before the respective IGBTs 11 of the power device 10 are switched from ON state to OFF state (step S106). Therefore, even when the respective IGBTs 11 of the power device 10 are switched from ON state to OFF state, the path of the current flowing in the wiring 18 or 20 is not cut off. Accordingly, the current flowing in the wiring 18 or 20 does not abruptly changes, which makes it possible to avoid an occurrence of over-voltage caused by an abrupt current change or by a parasitic inductance of the wiring 18 or 20. Hence, the over-voltage can be completely prevented from being applied to the power device 10.

Further, since the IGBT of the power device 10 is switched from OFF state to ON state after the current flowing in the power device 10 has reached the specific level, the L load test of the power device 10 can be prevented from being hindered by external factors caused by switching the state of the IGBT of the power device protection circuit 21 or the like.

In the aforementioned test circuit 5, the current capacity of the power device protection circuit 21 is set to be greater than that of the power device 10, and the inner resistance of the power device protection circuit 21 is set to be smaller than that of the power device 10. Accordingly, it is easy to change the current supply direction (from the power device 10 to the power device protection circuit 21) and, hence, the occurrence of the external factors or the like can be prevented.

Further, when high current is made to flow between the collector and the emitter in each of the IGBTs 11 of the power device 10 during the L load test or the like, the current may still flow therebetween even when a corresponding IGBT has been switched to OFF state (latch-up phenomenon). The latch-up phenomenon occurs in a few cells at most among a plurality of cells of the power device. If the latch-up phenomenon occurs in a few cells of a power device in a conventional inspection device having no power device protection circuit provided in parallel with the power device, the corresponding cells are destroyed by the high current concentrated thereon. Meanwhile, even if the latch-up phenomenon occurs in a few cells of the power device 10 in the above-described test circuit 5, the high current is not concentrated on the corresponding cells. This is because, when the respective IGBTs 11 of the power device 10 are switched to OFF state, the current supply direction is changed to the power device protection circuit 21. In other words, the test circuit 5 can prevent the cells from being destroyed by the latch-up phenomenon.

In the aforementioned processes of FIG. 4, the respective IGBTs 11 of the power device 10 are switched from ON state to OFF state 200 nsec after the IGBT of the power device protection circuit 21 is switched from OFF state to ON state. However, the respective IGBTs 11 of the power device 10 can be switched from ON state to OFF state simultaneously when the IGBT of the power device protection circuit 21 is switched from OFF state to ON state. In the IGBT, time required for electrically connecting the collector and the emitter after switching the IGBT from OFF state to ON state is extremely shorter than time required for electrically disconnecting the collector and the emitter after switching the IGBT from ON state to OFF state. Therefore, even if the switching operations are simultaneously performed, a current flow path is not cut off and, also, the current does not abruptly changes.

Moreover, the IGBT of the power device protection circuit 21 may be switched from OFF state to ON state immediately after the current flowing in the corresponding power device 10 reaches a specific level during the L load test.

The power device 10 has a plurality of cells, so that the high current can flow even when a few cells are destroyed. Since the above-described L load test checks whether or not the current flowing in the power device 10 has reached a specific level, it is difficult to precisely check whether each of the cells in the power device 10 is normal or abnormal. Further, the cells can be destroyed before the L load test or when the current is supplied during the L load test.

To that end, it is preferable to perform a static characteristic test of the power device 10 before and after performing the aforementioned processes of FIG. 4. The static characteristic test includes a leakage test for checking an insulation property between the collector and the emitter in the respective IGBTs 11 of the power device 10 in OFF state, a saturation test for measuring current between the collector and the emitter which has reached a specific level by increasing a driving voltage applied to the gate, a voltage threshold test for measuring a driving voltage in switching the power device 10 to ON state and the like. Accordingly, it is possible to avoid an unnecessary performance of the L load test and also possible to check whether the IGBTs of the power device 10 are destroyed or not during the L load test. As a result, inferior goods can be prevented from being supplied.

Although the power device having an IGBT is suggested as a DUT by the inspection device 1 in the aforementioned embodiment, the DUT is not limited thereto and further can be an apparatus capable of flowing high current therethrough by switching ON/OFF state thereof. Further, the circuit for protecting a DUT may not have an IGBT and further can be a circuit capable of flowing high current therethrough by switching ON/OFF state thereof.

Hereinafter, a test example of the present invention will be described in detail.

TEST EXAMPLE

First of all, there were prepared the above-described inspection device 1 and a wafer W having thereon a plurality of power devices 10. Next, an L load test of a power device 10 formed on the wafer W was performed by using the inspection device 1. In the L load test, the IGBT of the power device protection circuit 21 was switched from OFF state to ON state after checking that the current flowing in the corresponding power device 10 has reached a specific level. Then, 200 nsec later, the respective IGBTs 11 of the power device 10 were switched from ON state to OFF state. During the L load test, a voltage $V_{GE}$ between the gate and the emitter and a voltage $V_{CE}$ between the collector and the emitter in each of the IGBTs 11 of the power device 10 were monitored. A result thereof is shown in the graph of FIG. 6B.

COMPARATIVE EXAMPLE

Above all, there were prepared an inspection device in which the power device protection circuit 21 is removed from the test circuit 5 of the above-described inspection device 1 and a wafer W having thereon a plurality of power devices 10. Next, an L load test of a power device 10 formed on the wafer W was performed by using the inspection device. In the L load test, the respective IGBTs 11 of the power device 10 were switched from ON state to OFF state after checking that the current flowing in the corresponding power device 10 has reached a specific level. During the L load test, a voltage $V_{GE}$ between the gate and the emitter and a voltage $V_{CE}$ between the collector and the emitter in each of the IGBTs 11 of the power device 10 were monitored. A result thereof is illustrated in the graph of FIG. 6A.

Figure 6A:
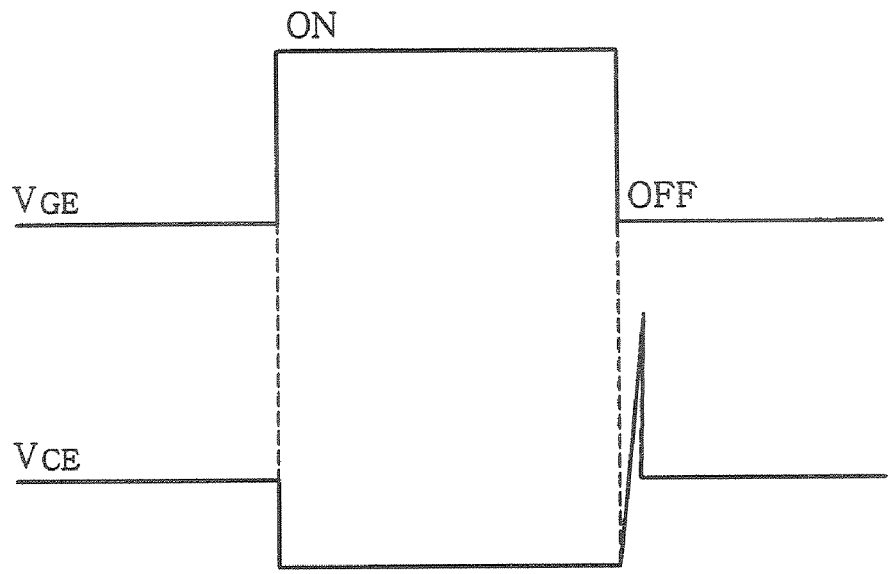
Figure 6B:
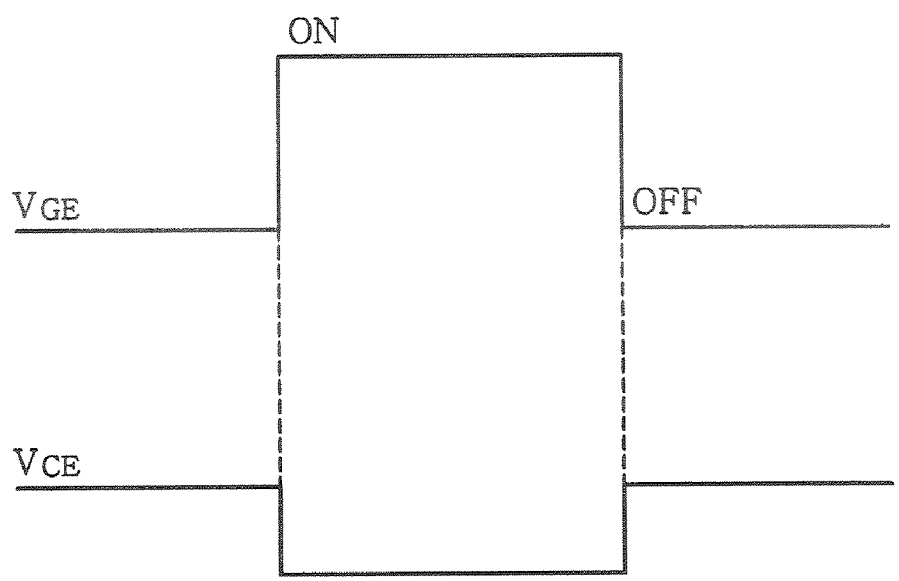

Referring to the graphs of FIGS. 6A and 6B for comparison, when the respective IGBTs 11 of the power device 10 were switched from ON state to OFF state in the comparative example, the over-voltage was applied between the collector and the emitter. However, when the respective IGBTs 11 of the power device 10 were switched from ON state to OFF state in the test example, the over-voltage was not applied between the collector and the emitter. Therefore, it was found that the power device protection circuit 21 arranged in parallel with the power device 10 in the test circuit 5 can prevent the occurrence of the over-voltage even when the respective IGBTs 11 of the power device 10 are switched from ON state to OFF state.

While the invention has been shown and described with respect to the embodiments, it will be understood by those skilled in the art that various changes and modification may be made without departing from the scope of the invention as defined in the following claims.

What is claimed is:

1. A circuit for protecting a device under test (DUT), wherein the circuit and the DUT are connected in parallel to a power supply supplying current to the DUT, and wherein the DUT is switchable between conducting and non-conducting states, wherein and the circuit is switchable between conducting and non-conducing, states, and
    wherein the circuit is switched from the non-conducting state to the conducting state before the DUT is switched from the conducting state to the non-conducting state, so that the current supplied from the power supply to the DUT flows through the circuit when the DUT is switched from the conducting state to the non-conducting state.

2. The circuit of claim 1, wherein the circuit is switched from the non-conducting state to the conducting state after the DUT is in a required test state.

3. The circuit of claim 1, wherein the circuit and the DUT have insulated gate bipolar transistors (IGBTs) where time required for electrically connecting a collector and an emitter of each of the IGBTs upon switching on is shorter than time required for electrically disconnecting the collector and the emitter upon switching off.

4. The circuit of claim 1, wherein current capacity of the circuit is set to be greater than that of the DUT, and internal resistance of the circuit is set to be smaller than that of the DUT.

5. A method for protecting a device under test (DUT) which is supplied with current from a power supply, and wherein the DUT is switchable between conducting and non-conducting states, the method comprising the steps of:
    connecting a circuit for protecting the DUT to the power supply, the circuit and the DUT being connected in paralled to the power supply, and wherein the circuit is switchable between conducting and non-conducting states; and
    switching the circuit from the non-conducting state to the conducting state before the DUT is switched from the conducting state to the non-conducting state, so that the current supplied from the power supply to the DUT flows through the circuit when the DUT is switched from the conducting state to the non-conducting state.

6. The method of claim 5, wherein in the step of switching the circuit to the conducting state, the circuit is switched from the non-conducting state to the conducting state after the DUT exhibits a required test state.

7. The method of claim 5, wherein the circuit and the DUT have insulated gate bipolar transistors (IGBTs) where time required for electrically connecting a collector and an emitter of each of the IGBTs upon switching on is shorter than time required for electrically disconnecting the collector and the emitter upon switching off, and
    wherein in the step of switching the circuit to conducting state, a turn-on signal and a turn-off signal are simultaneously supplied to the circuit and the DUT, respectively.

8. The method of claim 5, wherein current capacity of the circuit is set to be greater than that of the DUT, and internal resistance of the circuit is set to be smaller than that of the DUT.

9. A testing apparatus comprising:
    a power supply; and
    a circuit for protecting a device under test (DUT), the circuit and the DUT being connected in parallel to the power supply and wherein the circuit and the DUT are each switchable between conducting and non-conducting states, and further wherein the power supply supplies current to the DUT, and
    wherein the circuit is switched from the non-conducting state to the conducting state before the DUT is switched from the conducting state to the non-conducting state, so that the current supplied from the power supply to the DUT flows through the circuit when the DUT is switched from the conducting state to the non-conducting state.

10. The testing apparatus of claim 9, wherein current capacity of the circuit is set to be greater than that of the DUT, and internal resistance of the circuit is set to be smaller than that of the DUT.

11. A testing method for use in a testing apparatus which includes a power supply for supplying current to a device under test (DUT) which is switchable between conducting and non-conducting states, the method comprising the steps of:
    connecting a circuit for protecting the DUT to the power supply, the circuit and the DUT being connected in parallel to the power supply, and wherein the circuit being switchable between conducting and non-conducting states;
    performing a dynamic characteristic test, wherein the current is supplied to the DUT by switching the DUT to the conducting state; and
    switching the circuit from the non-conducting state to the conducting state before the DUT is switched from the conducting state to the non-conducting state, so that the current supplied from the power supply to the DUT flows through the circuit when the DUT is switched from the conducting state to the non-conducting state.

12. The testing method of claim 11, further comprising a step of performing a static characteristic test of the DUT.

13. The testing method of claim 12, further comprising:
    performing a first static characteristic test of the DUT before performing the dynamic characteristic test; and
    performing a second static characteristic test of the DUT after performing the dynamic characteristic test.

14. The testing method of claim 11, wherein current capacity of the circuit is set to be greater than that of the DUT, and internal resistance of the circuit is set to be smaller than that of the DUT.

* * * * *